US011888379B2

(12) United States Patent
Schneider (10) Patent No.: US 11,888,379 B2
(45) Date of Patent: Jan. 30, 2024

(54) ELECTRICAL SYSTEM WITH CLOSED COMPARTMENT FOR PREVENTING ACCESS TO AN ELECTRICAL CONDUCTOR EXTENDING IN THE COMPARTMENT AND METHODS FOR ALLOWING AND PREVENTING ACCESS TO AN ELECTRICAL CONDUCTOR (71) Applicant: Valeo Siemens eAutomotive Germany GmbH, Erlangen (DE)

(72) Inventor: Guido Schneider, Erlangen (DE)

(73) Assignee: Valeo Siemens eAutomotive Germany GmbH, Erlangen (DE)

( * ) Notice: Subject to any disclaimer, the term of this patent is extended or adjusted under 35 U.S.C. 154(b) by 278 days.

(21) Appl. No.: 17/452,672

(22) Filed: Oct. 28, 2021

(65) Prior Publication Data

US 2022/0140690 A1 May 5, 2022

(30) Foreign Application Priority Data

Oct. 30, 2020 (DE) ...................... 10 2020 128 626.0

(51) Int. Cl.
*H02K 11/30* (2016.01)
*H02K 5/22* (2006.01)
*H05K 5/02* (2006.01)
*H05K 5/03* (2006.01)

(52) U.S. Cl.
CPC ............ *H02K 5/225* (2013.01); *H02K 11/30* (2016.01); *H05K 5/0208* (2013.01); *H05K 5/0221* (2013.01); *H05K 5/03* (2013.01)

(58) Field of Classification Search
CPC ........ H05K 5/022; H05K 5/0208; H05K 5/03; H02K 5/225; H02K 11/30
See application file for complete search history.

(56) References Cited

U.S. PATENT DOCUMENTS

2013/0171851 A1 7/2013 Neukam
2015/0364858 A1* 12/2015 Koszeghy ................. B60L 3/04
439/660

FOREIGN PATENT DOCUMENTS

DE 102011004625 A1 8/2012
DE 202015006792 U1 11/2015

OTHER PUBLICATIONS

Office Action issued in European Application No. 21203024.1, dated Apr. 5, 2022 (9 pages).

* cited by examiner

*Primary Examiner* — Ramon M Barrera
(74) *Attorney, Agent, or Firm* — Osha Bergman Watanabe & Burton LLP (57) ABSTRACT The electrical system comprises a cover (206) for closing the compartment (204) defined in a housing (202). The electrical system further comprises a removable element (214) configured to be mounted proximate to the housing (202), and a mobile hook (208) attached to one amongst the cover (206) and the housing (202), and configured to take an engaged position with the other amongst the cover (206) and the housing (202) and a disengaged position from the other from the cover (206) and the housing (202), wherein the removable element (214), when mounted proximate to the housing (202), is configured to cooperate with the mobile hook (208) to prevent the cover (206) from being separated from the housing (202), thereby preventing an opening of the compartment (204).

14 Claims, 14 Drawing Sheets

ELECTRICAL SYSTEM WITH CLOSED COMPARTMENT FOR PREVENTING ACCESS TO AN ELECTRICAL CONDUCTOR EXTENDING IN THE COMPARTMENT AND METHODS FOR ALLOWING AND PREVENTING ACCESS TO AN ELECTRICAL CONDUCTOR

The present invention relates to an electrical system with closed compartment for preventing access to an electrical conductor extending in the compartment and methods for allowing and preventing access to an electrical conductor.

It is known from the prior art to use an electrical system, comprising:
- a housing delimiting a compartment;
- at least one electrical conductor extending in the compartment; and
- a cover for closing the compartment for preventing access to each electrical conductor.

For example, such electrical system is used to prevent access to connections between an inverter and a rotating electrical machine. Indeed, the inverter generally comprises phase busbars for providing phase voltages to the rotating electrical machine, and the rotating electrical machine comprises phase cables terminated by respective phase terminals respectively connected to the busbars. The phase voltage can be high, for example 480 V. Access to the phase busbars and cable terminals must therefore be prevented as long as they may exhibit such high voltage.

To this end, a known procedure is to provide the electrical system with an interlock system, which detects removal of the cover and, in response, decreases the phase voltages. The voltage decreasing rate is for example such that the phase voltages must pass under 60 V in at most 2 seconds, so that it is safe for the operator.

Removing the cover must therefore be difficult enough so that it requires more than 2 seconds. Such an interlock system comprises for instance a screw fixing the cover with the housing. The removal of the screw opens an electrical circuit or triggers a device so as to discharge capacitors of the electrical system.

However, it is preferable to limit the use of screws, because during the manufacturing process, they can be lost and even come inside non easily accessible parts in the final product. Moreover, dismounting the screw may be long whereas the voltage decreasing itself can be relatively fast. The duration of the mounting of the screw can also be relatively long during the manufacturing process.

It may thus be desirable to provide an electrical system with a closed compartment for preventing access to an electrical conductor extending in the compartment, which allows an efficient interlock function while being easy to manufacture.

An object of the invention is therefore an electrical system comprising:
- a housing delimiting a compartment;
- at least one electrical conductor extending in the compartment; and
- a cover for closing the compartment for preventing access to each electrical conductor;

characterized by:
- a removable element configured to be mounted proximate to the housing; and
- a mobile hook attached to one amongst the cover and the housing, and configured to take:
  - an engaged position in which the mobile hook is engaged with the other amongst the cover and the housing to prevent the cover from being separated from the housing to open the compartment, and
  - a disengaged position in which the mobile hook is disengaged from the other from the cover and the housing to allow the cover to be separated from the housing, thereby allowing an opening of the compartment;

and in that the removable element, when mounted proximate to the housing, is configured to cooperate with the mobile hook to prevent the cover from being separated from the housing, thereby preventing an opening of the compartment.

As the mobile hook is attached to the cover or the housing, it cannot be lost. The assembly of the cover with the housing can be faster than in the prior art. In addition, by preventing an actuation of the mobile hook, the removable element prevents any opening of the cover if proper conditions are not met, for instance if an interlock system had not been actuated by the removable element.

Optionally, the removable element, when mounted proximate to the housing, is configured to block the mobile hook in order to prevent the mobile hook from reaching its disengaged position.

Also optionally, the mobile hook comprises a flexible tab carrying a first protrusion extending in a recess of the housing in its engaged position and entirely outside of the recess in its disengaged position.

Also optionally, the removable element, when mounted proximate to the housing, is configured for blocking the mobile hook, when the mobile hook is in its disengaged position, in order to prevent separation of the cover from the housing, thereby preventing an opening of the compartment.

Also optionally, the mobile hook comprises a second protrusion projecting opposite the first protrusion, and the removable element, when mounted proximate to the housing, is configured to block the second protrusion in order to prevent the cover from being separated from the housing, thereby preventing an opening of the compartment.

Also optionally, the electrical system comprises an electrical device for detecting removal of the removable element and, in response, decreasing a voltage on the electrical conductor.

Also optionally, wherein the mobile hook exhibits a pushing surface configured for being pushed to move the mobile hook from its engaged position to its disengaged position.

Also optionally, the mobile hook is attached to the cover.

Also optionally, the electrical system further comprises a rotating electrical machine, an inverter for providing phase voltages to the rotating electrical machine and a plurality of said electrical conductors extending in said compartment, the plurality of electrical conductors being configured to respectively exhibit the phase voltages.

Also optionally, the electrical system further comprises, in addition to said housing delimiting said compartment, called first housing, a second housing enclosing said rotating electrical machine and a third housing enclosing said inverter, said first housing extends from said second housing so as to define a space between said first housing and said second housing, the third housing is located in said space against said first housing, and the removable element is a component of said inverter.

Also optionally, the removable element comprises a control plug configured for being plugged in into a control socket of the inverter for conveying control signals to the inverter.

Another object of the invention is a method for allowing access at least one electrical conductor extending in a compartment delimitated by a housing and closed by a cover for preventing access to each electrical conductor, comprising:

removing a removable element proximate to the housing;

moving a mobile hook attached to one amongst the cover and the housing from:

an engaged position in which the mobile hook is engaged with the other amongst the cover and the housing to prevent the cover from being separated from the housing, thereby preventing an opening of the compartment, to a disengaged position in which the mobile hook is disengaged from the other from the cover and the housing to allow the cover to be separated from the housing, thereby preventing an opening of the compartment; and separating the cover from the housing to open the compartment; wherein the removable element, when mounted proximate to the housing, is configured to cooperate with the mobile hook to prevent the cover from being separated from the housing, thereby preventing an opening of the compartment.

Another object of the invention is a method for preventing access to at least one electrical conductor extending in a compartment delimitated by a housing, comprising:

moving a mobile hook attached to one amongst a cover and the housing to a disengaged position in which the cover can be moved to close the compartment;

closing the compartment by the cover;

moving the mobile hook from its disengaged position to an engaged position in which the mobile hook is engaged with the other amongst the cover and the housing to prevent the cover from being separated from the housing, thereby preventing an opening of the compartment; and mounting a removable element proximate to the housing, wherein the removable element, when mounted proximate to the housing, is configured to cooperate with the mobile hook to prevent the cover from being separated from the housing, thereby preventing an opening of the compartment.

Optionally, a method according to the invention further comprises the detection of the removal of the removable element by an electrical device which, in response, decreases a voltage on each electrical conductor.

The invention will be better understood with the aid of the description which follows, given only by way of example and made with reference to the accompanying drawings in which:

FIG. 2 is taken along the line II-II of FIG. 14.

Figure 1:
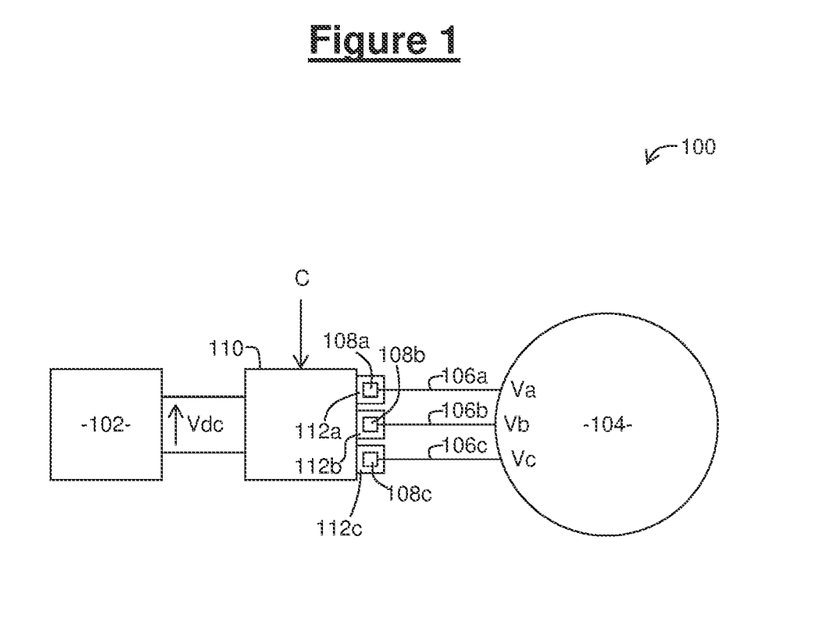
FIG. 1 is a diagram illustrating elements of an electrical system according to the invention.

Referring to FIG. 1, an electrical system 100 according to the invention will now be described.

The electrical system 100 comprises a DC voltage source 102, such as a battery, configured to provide a DC voltage Vdc.

The electrical system 100 further comprises a rotating electrical machine 104 configured to receive several AC phase voltages, three in the described example referenced Va-c. To this end, the rotating electrical machine 104 comprises phase cables 106*a-c* for respectively receiving the phase voltages Va-c. The phase cables 106*a-c* are respectively terminated by phase terminals 108*a-c*.

The rotating electrical machine 104 may for example by used in an electric car for driving wheels of the electric car.

The electrical system 100 further comprises an inverter 110 configured to receive control signals C to provide the phase voltages Va-c from the DC voltage Vdc. The inverter 110 comprises phase busbars 112*a-c* for respectively providing the phase voltages Va-c. For example, the inverter 110 comprises commutation legs for switching each phase voltage Va-c between the DC voltage Vdc and a zero voltage.

Referring to FIGS. 2 to 4 and 14, connection between the rotating electrical machine 104 and the inverter 110 will now be described in greater detail.

The electrical system 100 comprises, between an housing 104*h* enclosing the rotating electrical machine 104 and a housing 110*h* enclosing the inverter 110, a housing 202 delimiting a compartment 204.

Figure 14:
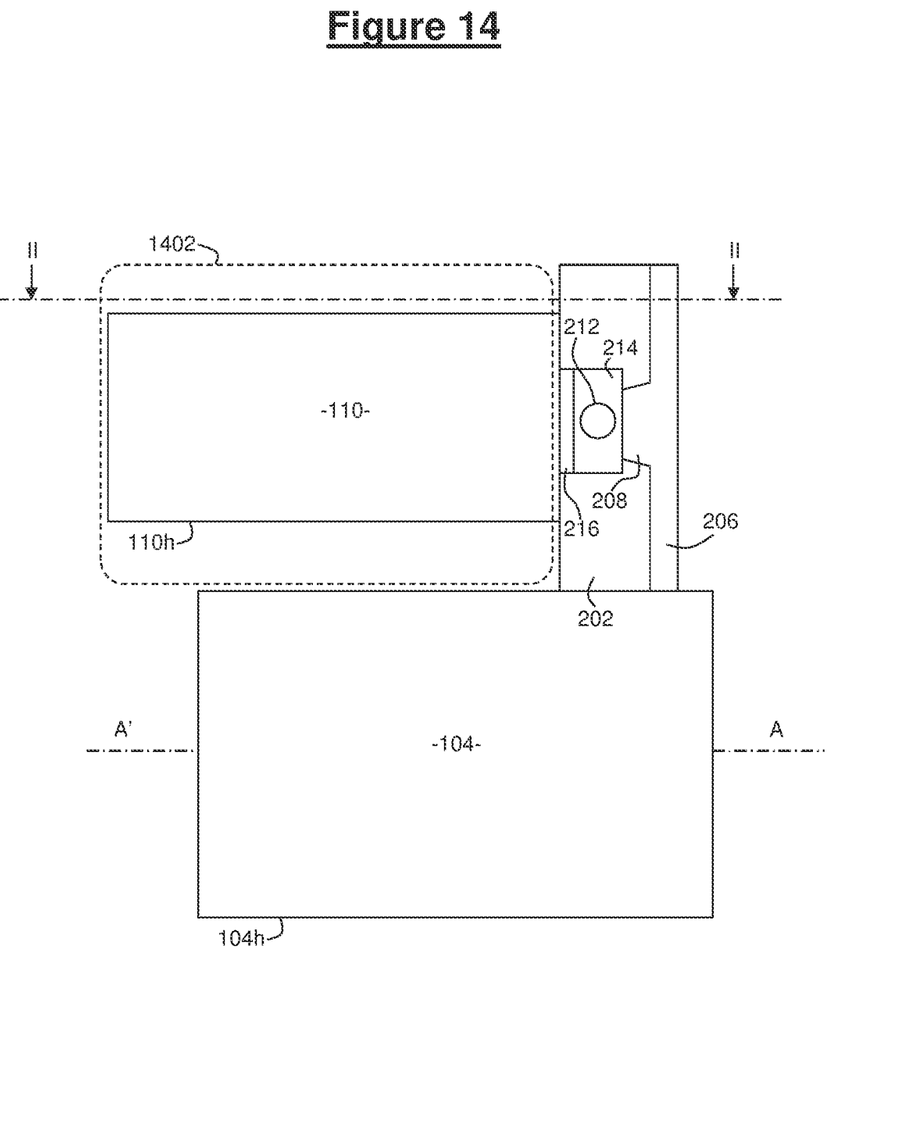
FIG. 14 is a view similar to FIG. 2, taken along the line XIV-XIV of FIG. 2.

More precisely, referring to FIG. 14, the housing 202 extends transversely (with respect to a rotation axis A-A' of the electrical machine 104) from the housing 104*h* of the rotating electrical machine 104 so as to define a space 1402 between the housing 202 and the housing 104*h*. The housing 110*h* of the inverter 110 is located in said space 1402 against the housing 202.

The safety of the electrical system 100 may thus be increased by the cooperation of the inverter 110 with the housing 202. This clever arrangement allows to obtain a compact electrical system 110 (inverter 110 in the space between both housings 202, 104*h*) and safety (as will be explained later, a component of the inverter 110 prevents an opening of the compartment 204).

For example, the housing 202 may be a protrusion from the housing 104*h* of the rotating electrical machine 104. The housing 202 and the housing 104*h* may therefore be formed in a single piece.

Figure 2:
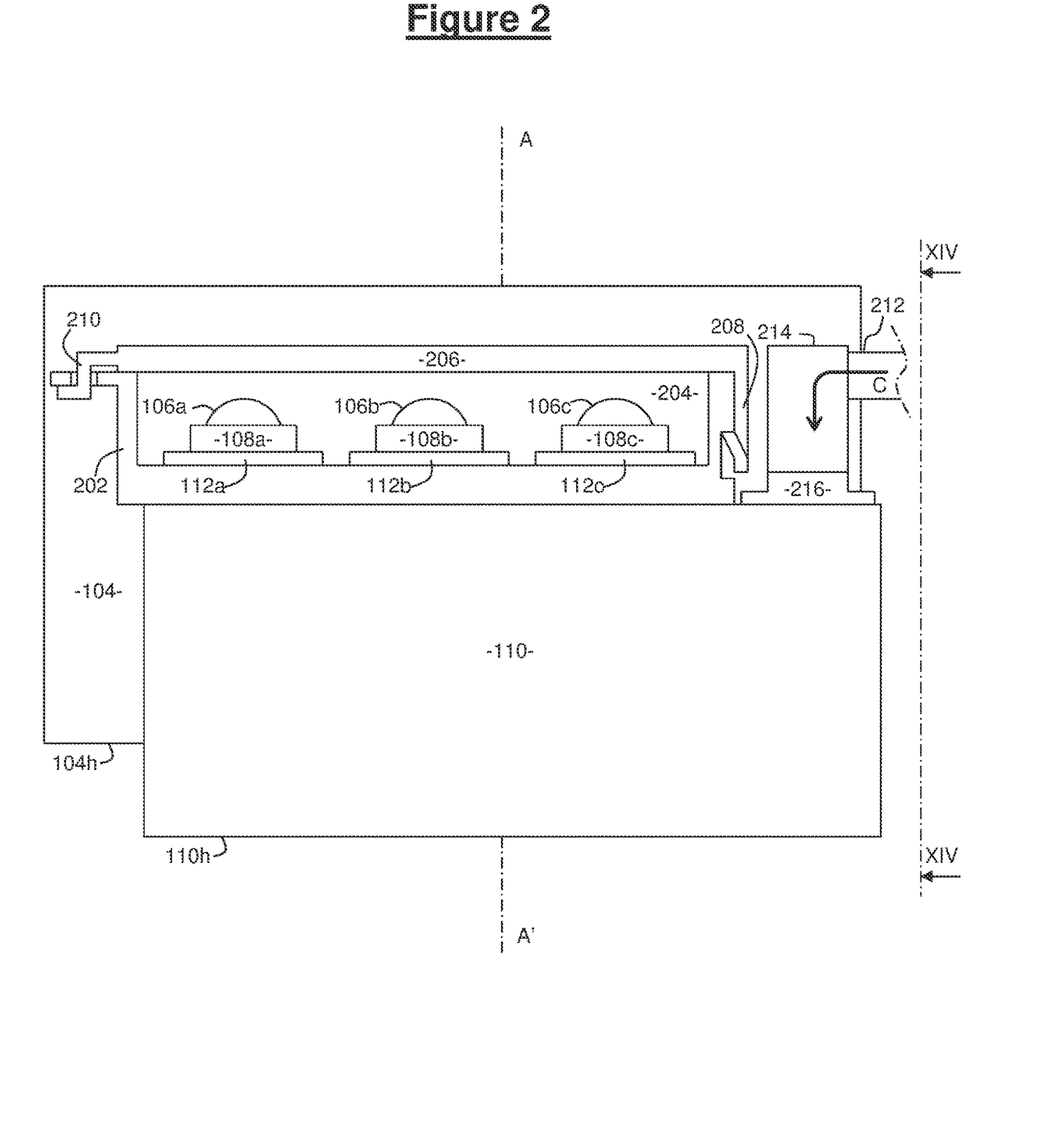
FIG. 2 is a simplified cross-section view of the electrical system of FIG. 1, depicting in particular a housing and a cover defining a closed compartment for preventing access to electrical conductors and a control plug mounted proximate to the housing.

Back to FIG. 2, the phase busbars 112a-c, the phase cables 106a-c and their phase terminals 108a-c extend in the compartment 204.

The electrical system 100 further comprises a cover 206 for closing the compartment 204 for preventing access to the phase busbars 112a-c and the phase terminals 108a-c.

The electrical system 100 further comprises a first hook 208 attached to the cover 206 and mobile with respect to the cover 206. The mobile hook 208 is configured to take an engaged position (illustrated on FIG. 2) in which the mobile hook 208 is engaged with the housing 202. In this engaged position, the mobile hook 208 prevents the cover 206 from being separated from the housing 202 around the first hook 208 to open the compartment 204, i.e. to allow an operator to insert fingers into the compartment 204. For example, the mobile hook 208, when engaged with the housing 202, prevents the cover 206 from being separated from the housing 202 by more than 5 mm. The mobile hook 208 is also configured to take a disengaged position (illustrated on FIG. 3) in which the mobile hook 208 is disengaged from the housing 202. In this disengaged position, the mobile hook 208 allows the cover 206 to be separated from the housing 202 to open the compartment 204.

The electrical system 100 further comprises a second hook 210 fixed to the cover 206 and configured to be engaged with the housing 202 to prevent the cover 206 from being separated from the housing 202 around the fixed hook 210 to open the compartment 204. The fixed hook 210 is configured for being disengaged from the housing 202 by tilting the cover 206 by separating the cover 206 from the housing 202 around the mobile hook 208. In this manner, disengaging the fixed hook 210 requires to first disengage the mobile hook 208 to allow separation of the cover 206 from the housing 202 around the mobile hook 208.

For conveying the control signals C, the electrical system 100 further comprises a control cable 212 terminated by a component of the inverter 110, for instance a control plug 214 configured to be mounted (i.e. plugged, in the described example) into a control socket 216 of the inverter 110.

Once plugged in, the control plug 214 is configured to cooperate with the mobile hook 208 to prevent the cover 206 from being separated from the housing 202 around the mobile hook 208 to open the compartment 204.

In the described example, as illustrated on FIG. 2, the control plug 214 is configured, once plugged in, for facing the mobile hook 208 in order to block the mobile hook 208 so that the mobile hook 208 is prevented from reaching its disengaged position.

Figure 3:
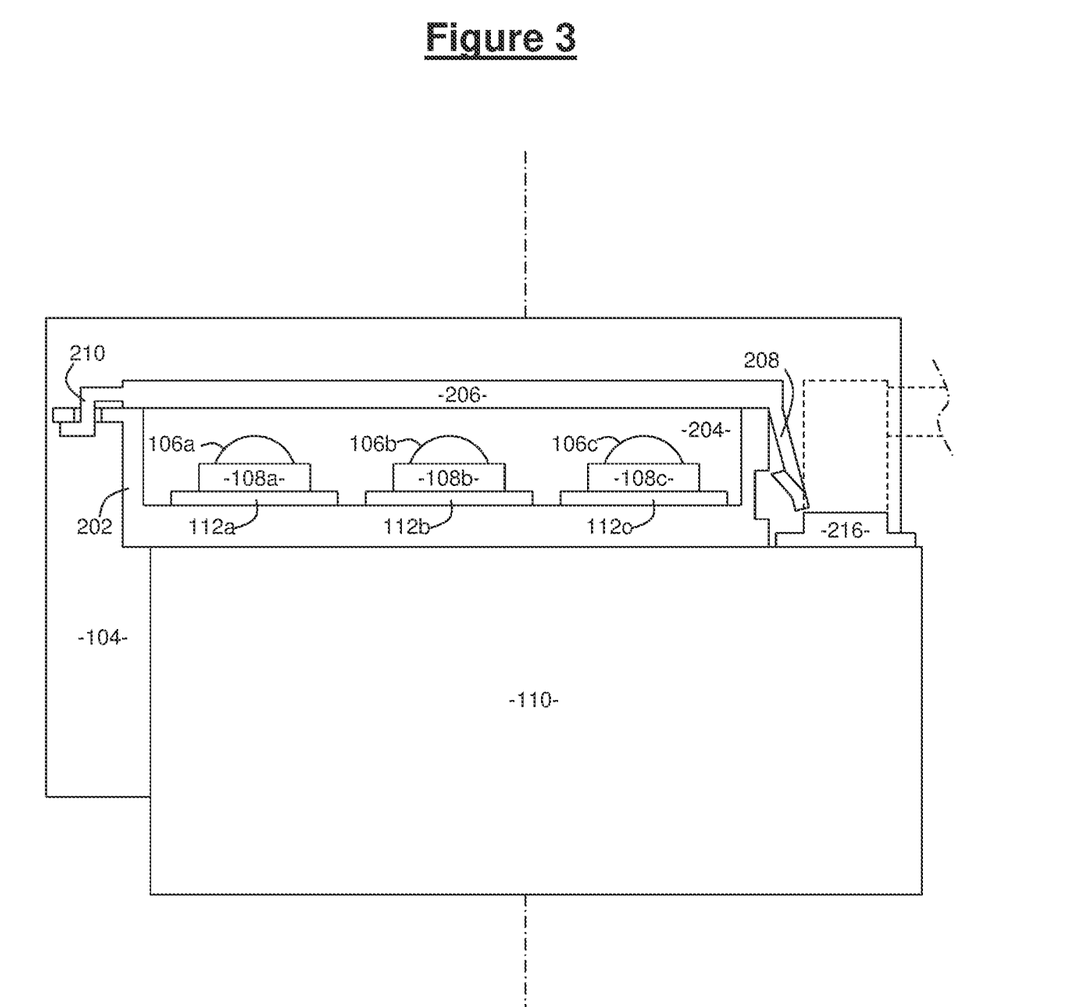
FIG. 3 is a view similar to the one of FIG. 2, with the control plug removed and a mobile hook of the cover disengaged from the housing.
Figure 4:
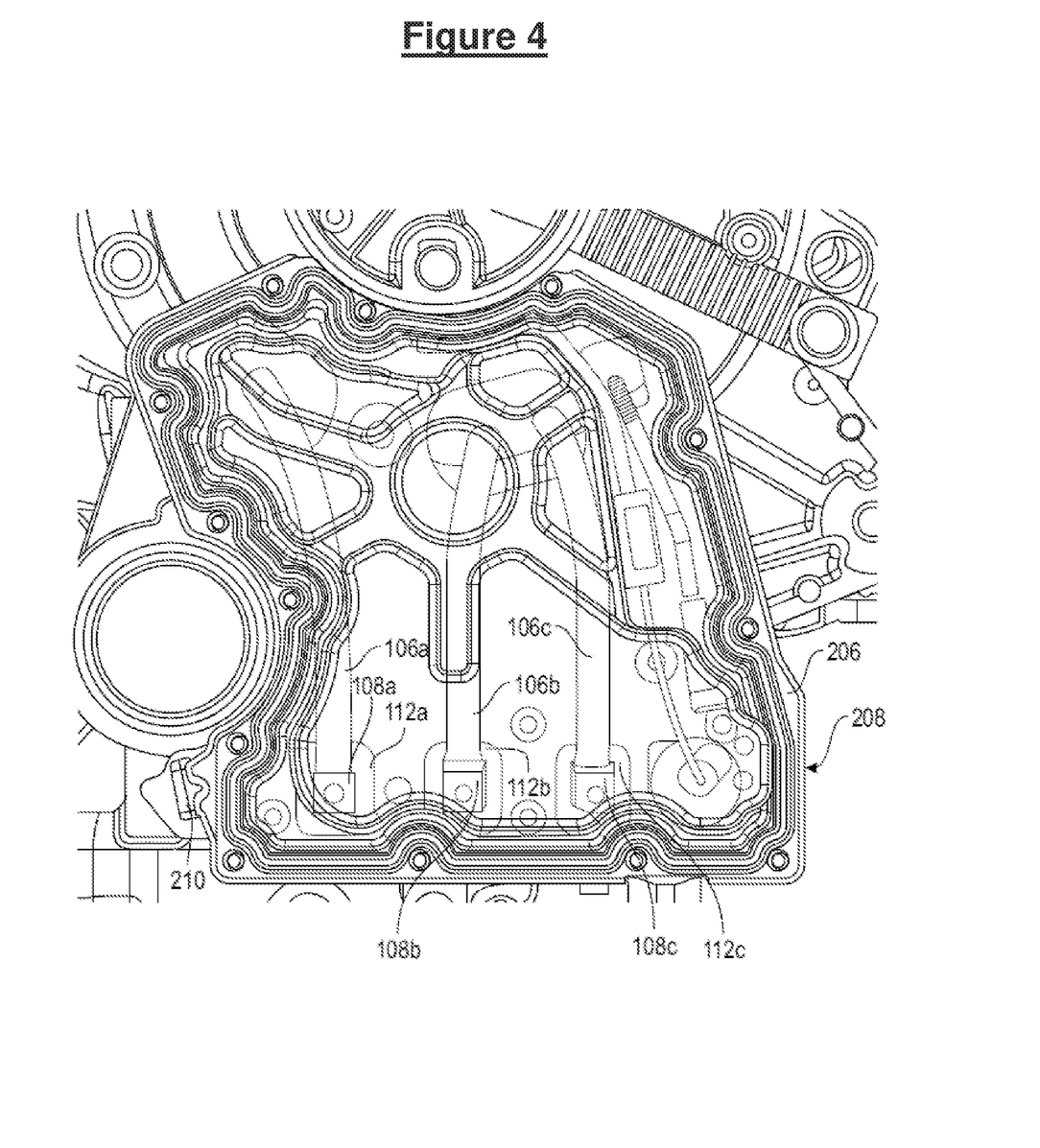
FIG. 4 is a three-dimensional view of the compartment with the cover being transparent.

As illustrated on FIG. 3, once the control plug 214 is removed, it is possible to make the mobile hook 208 reach its disengaged position to lift the cover 206.

Figure 5:
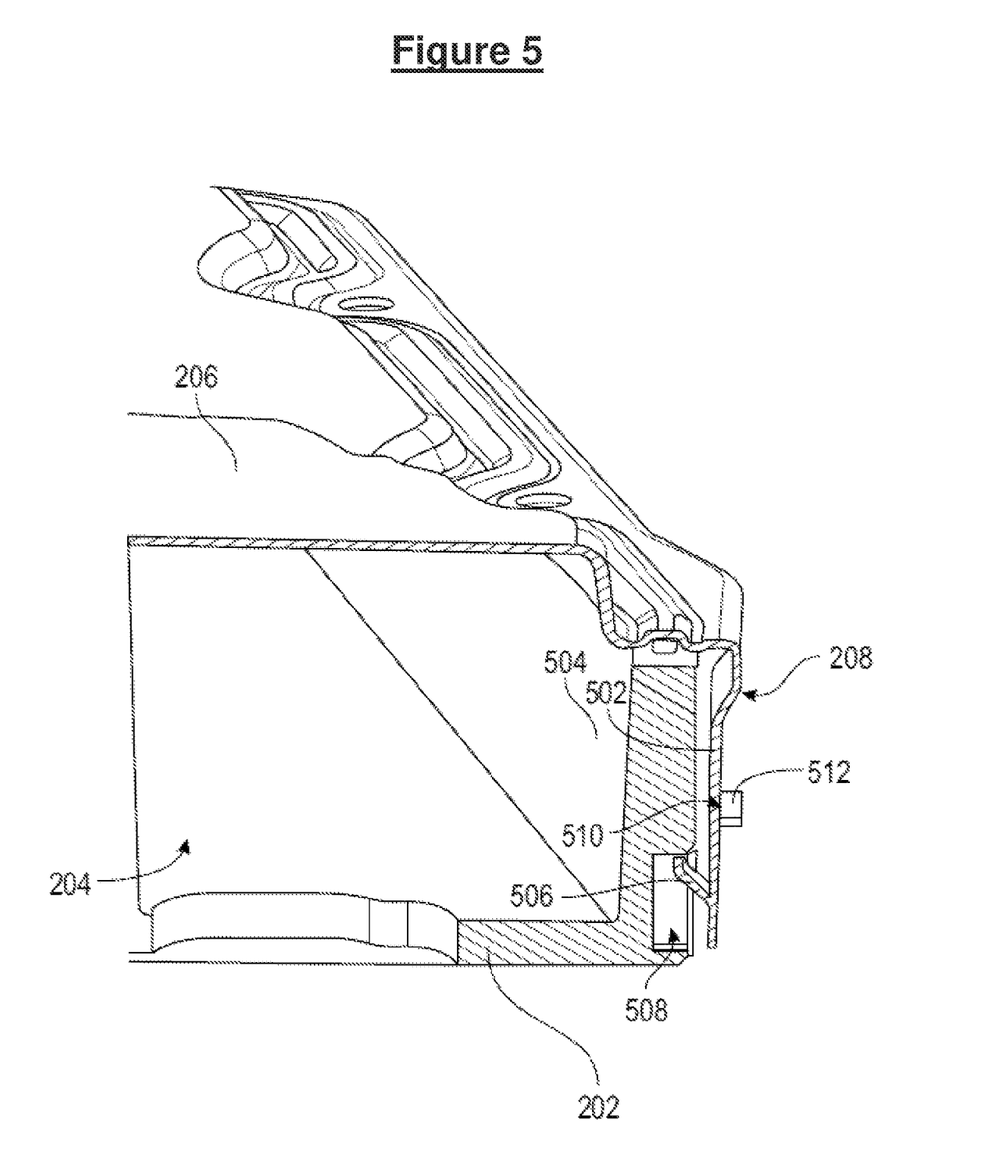
FIG. 5 is a three-dimensional cross-section view of the compartment with the mobile hook.
Figure 6:
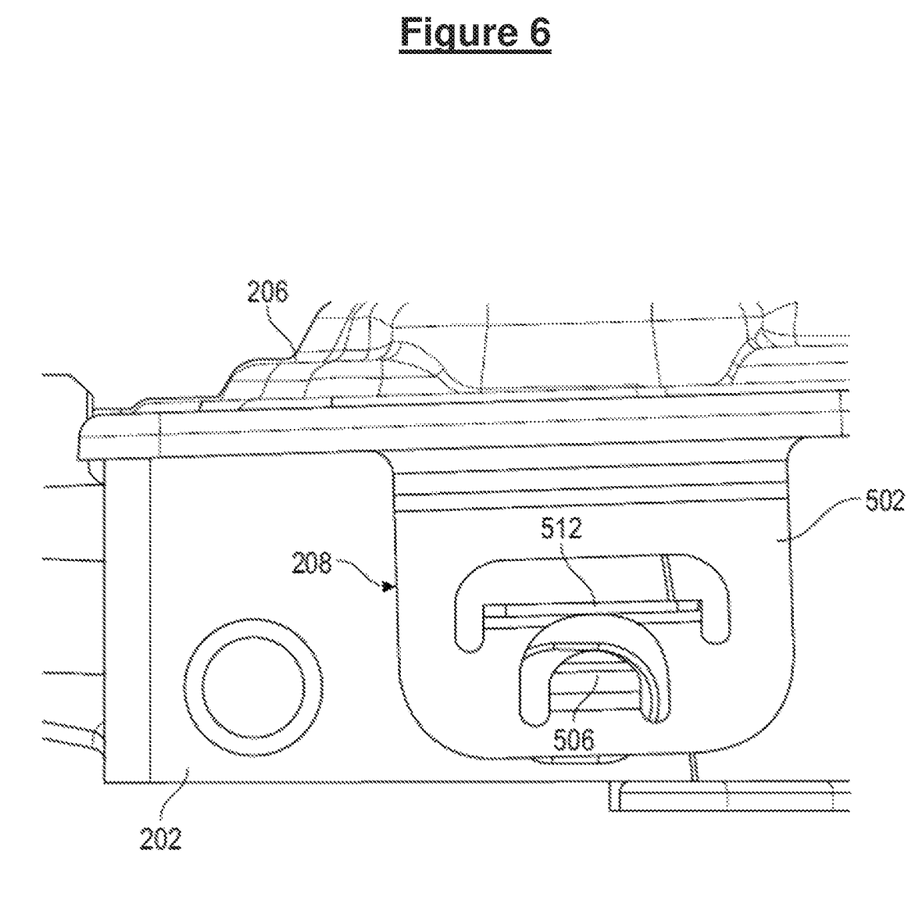
FIG. 6 is a three-dimensional view of the compartment centered on the mobile hook.

Referring to FIGS. 5 and 6, in the described example, the mobile hook 208 comprises a flexible tab 502 attached to the cover 206 and extending along a wall 504 of the housing 202. The flexible tab 502 carries a protrusion 506 projecting towards the wall 504. In the described example, the protrusion 506 comprises a strip cut out and bent to project from the flexible tab 502.

The wall 504 of the housing 202 is provided with a recess 508 in which the protrusion 506 extends in the engaged position of the mobile hook 208 (corresponding to a rest position of the flexible tab 502).

The mobile hook 208 exhibits a pushing surface 510 configured for being pushed, for example by an elongated tool such as a screwdriver, to move the mobile hook 208 from its engaged position, away from the wall 504 to its disengaged position, where the protrusion 506 extends entirely outside of the recess 508.

In the described example, the mobile hook 208 comprises a second strip 512 cut out and bent opposite the wall 504, the pushing surface 510 extending on this bent.

Figure 7:
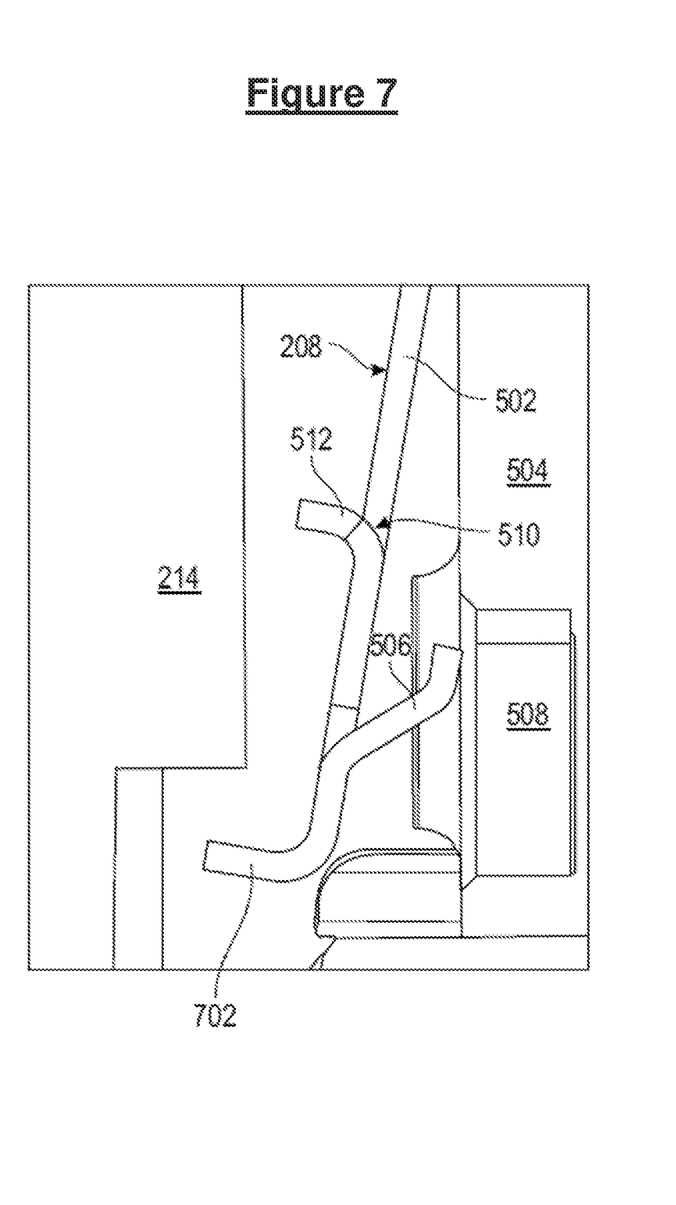
FIG. 7 is a cross-section view of a mobile hook according to another embodiment of the invention.
Figure 8:
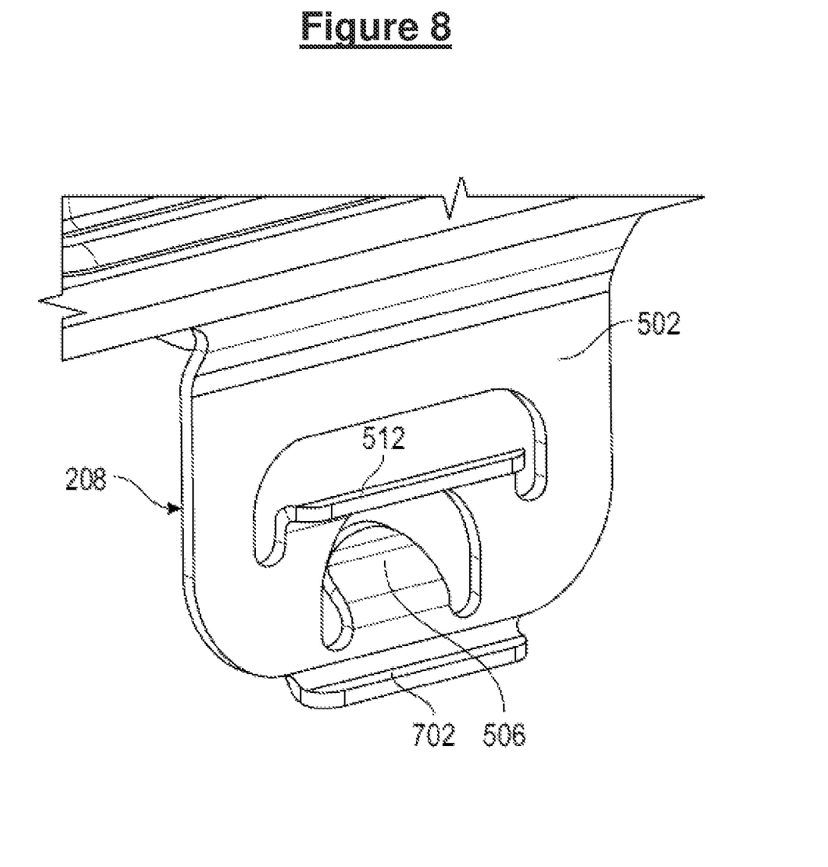
FIG. 8 is a tree-dimensional view of the mobile hook of FIG. 7.

Referring to FIGS. 7 and 8, in another embodiment, the control plug 214 may be located far enough from the mobile hook 208 so as to allow the mobile hook 208 to reach its disengaged position. This situation may occur for example due to construction clearance.

In order to still prevent opening of the compartment 204, the mobile hook 208 may comprise a second protrusion 702 projecting opposite the first protrusion 506. The second protrusion 702 is configured to be in front of the control plug 214 when the mobile hook 208 is in its disengaged position. In this manner, if one tries to lift up the cover 206, the second protrusion 702 is blocked by the control plug 214, thereby preventing separation of the cover 206 from the housing 202 to open the compartment 204.

Figure 9:
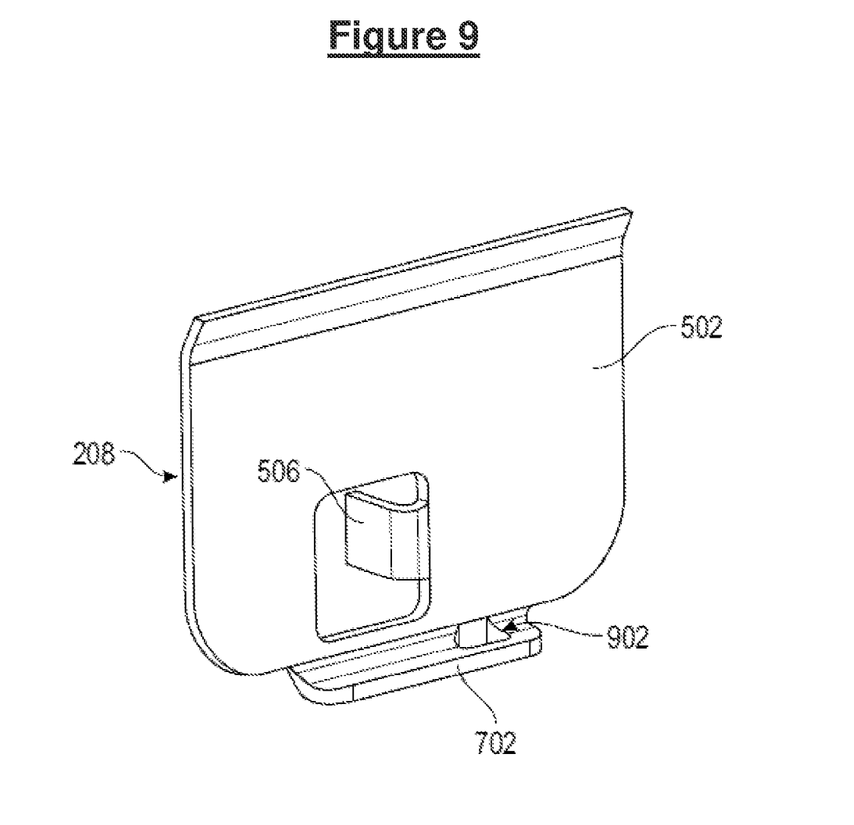
FIG. 9 is a tree-dimensional view of a mobile hook according to another embodiment of the invention.
Figure 10:
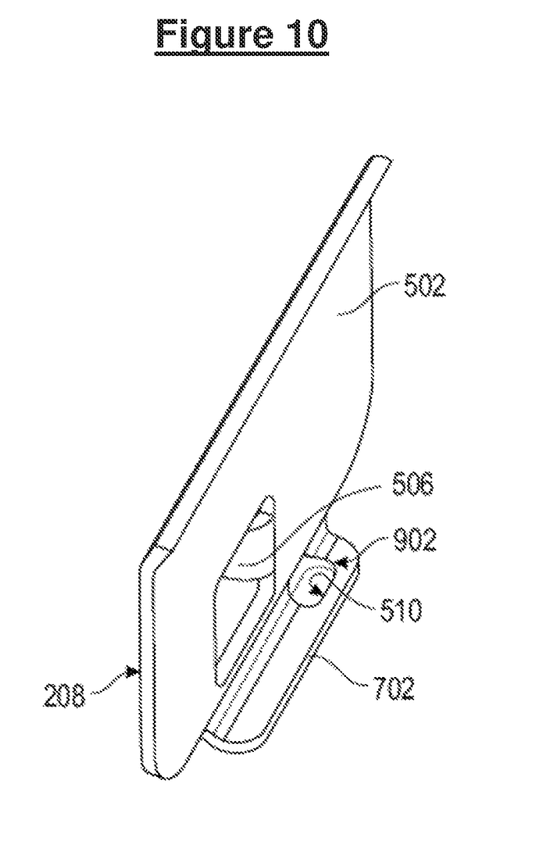
FIG. 10 is a tree-dimensional view of the mobile hook of FIG. 9 according to another point of view.

Referring to FIGS. 9 and 10, in another embodiment, the pushing surface 510 may extend inside a hole 902, for example provided in the second protrusion 702.

Figure 11:
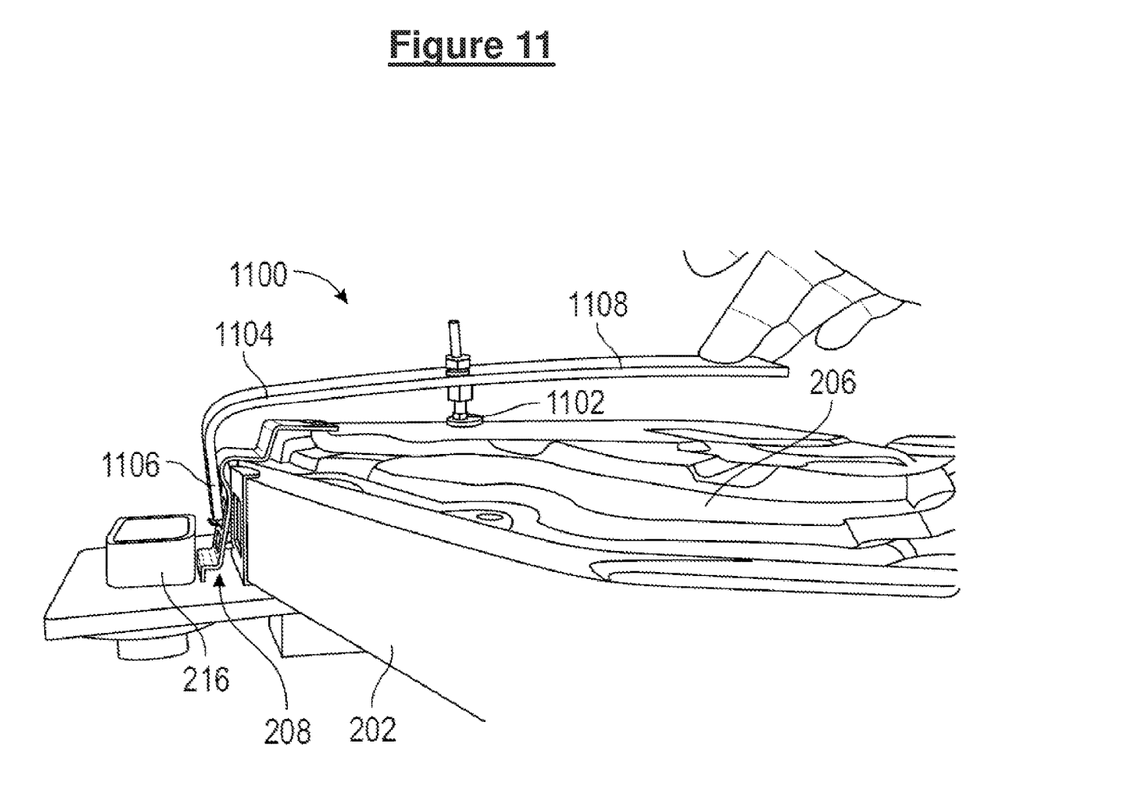
FIG. 11 is a tree-dimensional view of a tool according to the invention to move the mobile hook.

Referring to FIG. 11, a tool 1100 for moving the mobile hook 208 from its engaged position to its disengaged position will now be described.

The tool 1100 first comprises a fulcrum 1102 configure to come into contact with the cover 206. The tool 1100 further comprises a first lever branch 1104 extending from the fulcrum 1102 and having an end 1106, opposite the fulcrum 1102, configured to come into contact with the pushing surface 510 of the mobile hook 208. The tool 1100 further comprises a second lever branch 1108 extending from the fulcrum 1102 opposite the first lever branch 1104. An operator can therefore push the second lever branch 1108 to make the tool 1100 turn on the cover 206 around the fulcrum 1102 so that the end 1106 pushes the pushing surface. An advantage of this tool 1100 is that the second lever branch 1108, at a certain rotation of the tool 1100 around the fulcrum, comes into contact with the cover 206 and is blocked by the cover 206, thereby preventing further rotation. In this manner, by configuring appropriately the tool 1100, it is not possible to bend too much the flexible tab 502, for example such that the flexible tab 502 would experience plastic deformation. This ensures that the flexible tab 502 endures only elastic deformation.

Figure 12:
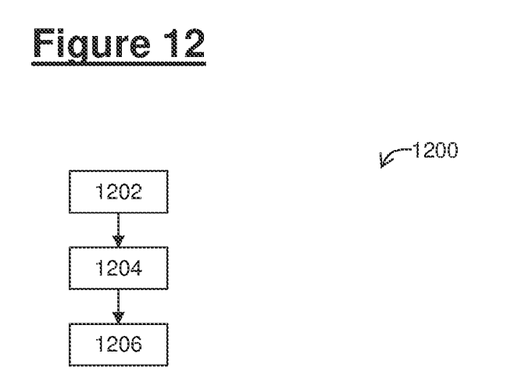
FIG. 12 is a block diagram illustrating steps of a method according to the invention for allowing access at least one electrical conductor extending in the compartment of previous figures.

Referring to FIG. 12, a method 1200 for allowing access to the phase busbars 112a-c and the phase terminals 108a-c will now be described.

At a step 1202, the control plug 214 is removed, i.e. unplugged. The removal is detected by the inverter 110 which, in response, decreases the voltage voltages Va-c on the phase busbars 112a-c, and in turn on the phase terminals 108a-c.

At a step 1204, the mobile hook 208 is moved from its engaged position to its disengaged position, for example using the tool 1100 or e.g. a screwdriver.

At a step 1206, the cover 206 is separated from the housing 202 to open the compartment 204. An operator is then able to access the phase busbars 112a-c and the phase terminals 108a-c, for example for disconnecting the phase terminals 108a-c from the phase busbars 112a-c.

Figure 13:
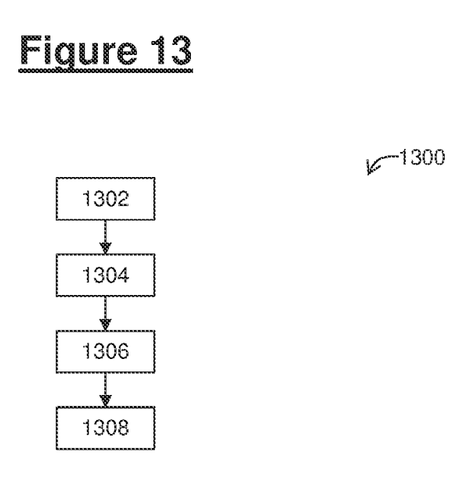
FIG. 13 is a block diagram illustrating steps of a method according to the invention for preventing access to at least one electrical conductor extending in the compartment of the previous figures.

Referring to FIG. 13, a method 1300 for preventing access to the phase busbars 112a-c and the phase terminals 108a-c will now be described.

At a step 1302, as the cover 206 is separated from the housing 202, the mobile hook 208 is moved to its disengaged position. This is done for example by bending the flexible tab 502, for example using the tool 1100. With the mobile hook 208 in its disengaged position, the cover 206 can be moved to close the compartment 204.

At a step 1304, the compartment 204 is closed by the cover 206.

At a step 1306, the mobile hook 208 is moved from its disengaged position to its engaged position. For example, the flexible tab 502 is let come back to its rest position, i.e. the engaged position, by elastic return.

At a step 1308, the control plug 214 is mounted to the housing 110h of the inverter 110, i.e. plugged into the control socket 216. At this point, the control plug 214 can cooperate with the mobile hook 208 to prevent the cover 206 from being separated from the housing 202 to open the compartment 204.

It is clear that an electrical system such as the one described above allows to prevent hazardous access to electrical conductor without the need of a remote screw.

It will also be noted that the invention is not limited to the embodiments described above. It will indeed appear to those skilled in the art that various modifications can be made to the embodiments described above, in the light of the teaching which has just been disclosed.

In the previous detailed description of the invention, the terms used should not be interpreted as limiting the invention to the embodiments presented in the present description, but should be interpreted to include all the equivalents within the reach of those skilled in the art by applying their general knowledge to the implementation of the teaching which has just been disclosed.

The invention claimed is:

1. An electrical system comprising:
a housing delimiting a compartment;
at least one electrical conductor extending in the compartment; and
a cover for closing the compartment for preventing access to each electrical conductor;
wherein:
a removable element configured to be mounted proximate to the housing; and
a mobile hook attached to one amongst the cover and the housing, and configured to take:
an engaged position in which the mobile hook is engaged with the other amongst the cover and the housing to prevent the cover from being separated from the housing to open the compartment, and
a disengaged position in which the mobile hook is disengaged from the other from the cover and the housing to allow the cover to be separated from the housing, thereby allowing an opening of the compartment; and
wherein the removable element, when mounted proximate to the housing, is configured to cooperate with the mobile hook to prevent the cover from being separated from the housing, thereby preventing an opening of the compartment.

2. The electrical system according to claim 1, wherein the removable element, when mounted proximate to the housing, is configured to block the mobile hook to prevent the mobile hook from reaching its disengaged position.

3. The electrical system according to claim 1, the mobile hook comprises a flexible tab carrying a first protrusion extending in a recess of the housing in its engaged position and entirely outside of the recess in its disengaged position.

4. The electrical system according to claim 3, wherein the removable element, when mounted proximate to the housing, is configured for blocking the mobile hook, when the mobile hook is in its disengaged position, in order to prevent separation of the cover from the housing (202), thereby preventing an opening of the 5 compartment.

5. The electrical system according to claim 4, wherein the mobile hook comprises a second protrusion projecting opposite the first protrusion, and wherein the removable element, when mounted proximate to the housing, is configured to block the second protrusion to prevent the cover from being separated from the housing, thereby preventing an opening of the compartment.

6. The electrical system according to claim 1, further comprising an electrical device for detecting removal of the removable element and, in response, decreasing a voltage on the electrical conductor.

7. The electrical system according to claim 1, wherein the mobile hook exhibits a pushing surface configured for being pushed to move the mobile hook from its engaged position to its disengaged position.

8. The electrical system according to claim 1, wherein the mobile hook is attached to the cover.

9. The electrical system according to claim 1, further comprising a rotating electrical machine, an inverter for providing phase voltages to the rotating electrical machine and a plurality of said electrical conductors extending in said compartment, the plurality of electrical conductors being configured to respectively exhibit the phase voltages.

10. The electrical system according to claim 9, further comprising, in addition to said housing delimiting said compartment, called first housing, a second housing enclosing said rotating electrical machine and a third housing enclosing said inverter, wherein said first housing extends from said second housing so as to define a space between said first housing and said second housing, wherein the third housing is located in said space against said first housing, and wherein the removable element is a component of said inverter.

11. The electrical system according to claim 9, wherein the removable element comprises a control plug configured for being plugged in into a control socket of the inverter for conveying control signals to the inverter.

12. A method for allowing access at least one electrical conductor extending in a compartment delimitated by a housing and closed by a cover for preventing access to each electrical conductor, comprising:
removing a removable element proximate to the housing;
moving a mobile hook attached to one amongst the cover and the housing from:
an engaged position in which the mobile hook is engaged with the other amongst the cover and the housing to prevent the cover from being separated from the housing, thereby preventing an opening of the compartment, to
a disengaged position in which the mobile hook is disengaged from the other from the cover and the housing to allow the cover to be separated from the housing, thereby allowing an opening of the compartment; and
separating the cover from the housing to open the compartment;
wherein the removable element, when mounted proximate to the housing, is configured to cooperate with the mobile hook to prevent the cover from being separated from the housing, thereby preventing an opening of the compartment.

13. The method for preventing access to at least one electrical conductor extending in a compartment delimitated by a housing comprising:

moving a mobile hook attached to one amongst a cover and the housing to a disengaged position in which the cover is moved to close the compartment;

closing the compartment by the cover;

moving the mobile hook from its disengaged position to an engaged position in which the mobile hook is engaged with the other amongst the cover and the housing to prevent the cover from being separated from the housing thereby preventing an opening of the compartment; and mounting a removable element proximate to the housing, wherein the removable element, when mounted proximate to the housing, is configured to cooperate with the mobile hook to prevent the cover from being separated from the housing, thereby preventing an opening of the compartment.

14. The method according to claim 12, further comprising the detection of the removal of the removable element by an electrical device which, in response, decreases a voltage on each electrical conductor.

\* \* \* \* \*